(12) United States Patent
Kholmovski et al.

(10) Patent No.: US 8,427,156 B2
(45) Date of Patent: Apr. 23, 2013

(54) SYSTEMS AND METHODS FOR IMAGE RECONSTRUCTION OF SENSITIVITY ENCODED MRI DATA

(75) Inventors: Evgueni G. Kholmovski, Salt Lake City, UT (US); Dennis Lee Parker, Centerville, UT (US); Edward V. R. DiBella, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 85 days.

(21) Appl. No.: 12/972,192

(22) Filed: Dec. 17, 2010

(65) Prior Publication Data

US 2011/0084693 A1   Apr. 14, 2011

Related U.S. Application Data

(63) Continuation of application No. 12/414,632, filed on Mar. 30, 2009, now Pat. No. 7,884,604, which is a continuation of application No. 11/412,073, filed on Apr. 25, 2006, now Pat. No. 7,511,495.

(60) Provisional application No. 60/675,002, filed on Apr. 25, 2005, provisional application No. 60/773,373, filed on Feb. 14, 2006.

(51) Int. Cl.
*G01V 3/00* (2006.01)
*A61B 5/05* (2006.01)

(52) U.S. Cl.
USPC ........... 324/310; 324/307; 324/309; 324/312; 600/410

(58) Field of Classification Search .......... 324/300–322; 600/407–435; 382/128–131, 254; 345/92; 702/85
See application file for complete search history.

(56) References Cited

U.S. PATENT DOCUMENTS 4,689,566 A * 8/1987 Maudsley ............... 324/309
5,262,725 A * 11/1993 Cuppen et al. ........... 324/312
(Continued)

OTHER PUBLICATIONS

Kholmovski et al., "Generalized Auto-Calibrating Technique for Image Reconstruction From Sensitivity Encoded MRI Data," Medical Imaging 2006: Physics of Medical Imaging, Proceedings of SPIE, (2006), pp. 107, vol. 6142, 61200.

(Continued)

*Primary Examiner* — Melissa Koval
*Assistant Examiner* — Tiffany Fetzner
(74) *Attorney, Agent, or Firm* — James W. Hill; McDermott Will & Emery LLP

(57) ABSTRACT

Methods and systems in a parallel magnetic resonance imaging (MRI) system utilize sensitivity-encoded MRI data acquired from multiple receiver coils together with spatially dependent receiver coil sensitivities to generate MRI images. The acquired MRI data forms a reduced MRI data set that is undersampled in at least a phase-encoding direction in a frequency domain. The acquired MRI data and auto-calibration signal data are used to determine reconstruction coefficients for each receiver coil using a weighted or a robust least squares method. The reconstruction coefficients vary spatially with respect to at least the spatial coordinate that is orthogonal to the undersampled, phase-encoding direction(s) (e.g., a frequency encoding direction). Values for unacquired MRI data are determined by linearly combining the reconstruction coefficients with the acquired MRI data within neighborhoods in the frequency domain that depend on imaging geometry, coil sensitivity characteristics, and the undersampling factor of the acquired MRI data. An MRI image is determined from the reconstructed unacquired data and the acquired MRI data.

20 Claims, 9 Drawing Sheets

U.S. PATENT DOCUMENTS

| | | | |
|---|---|---|---|
| 6,289,232 B1* | 9/2001 | Jakob et al. | 600/410 |
| 6,487,435 B2* | 11/2002 | Mistretta et al. | 600/420 |
| 6,567,684 B1* | 5/2003 | Chenevert et al. | 600/410 |
| 6,710,686 B2* | 3/2004 | Mertelmeier et al. | 324/314 |
| 6,717,406 B2* | 4/2004 | Sodickson | 324/307 |
| 6,777,934 B2* | 8/2004 | Takahashi et al. | 324/309 |
| 6,794,869 B2* | 9/2004 | Brittain | 324/309 |
| 6,841,998 B1* | 1/2005 | Griswold | 324/309 |
| 6,842,000 B2* | 1/2005 | Norris et al. | 324/309 |
| 6,897,655 B2* | 5/2005 | Brittain et al. | 324/309 |
| 7,282,917 B1* | 10/2007 | Brau et al. | 324/318 |
| 7,397,242 B2* | 7/2008 | Samsonov et al. | 324/309 |
| 7,411,395 B2* | 8/2008 | Hennig | 324/307 |
| 7,486,075 B2* | 2/2009 | Brau et al. | 324/309 |
| 7,495,437 B2* | 2/2009 | Griswold et al. | 324/307 |
| 7,511,495 B2* | 3/2009 | Kholmovski et al. | 324/310 |
| 7,619,411 B2* | 11/2009 | Reeder | 324/312 |
| 7,692,425 B2* | 4/2010 | Brau et al. | 324/309 |
| 7,863,893 B2* | 1/2011 | Griswold et al. | 324/307 |
| 7,884,604 B2* | 2/2011 | Kholmovski et al. | 324/309 |
| 7,902,823 B2* | 3/2011 | Griswold et al. | 324/307 |
| 2001/0027262 A1* | 10/2001 | Mistretta et al. | 600/9 |
| 2002/0158632 A1* | 10/2002 | Sodickson | 324/307 |
| 2002/0175683 A1* | 11/2002 | Mertelmeier et al. | 324/314 |
| 2004/0071324 A1* | 4/2004 | Norris et al. | 382/128 |
| 2006/0050981 A1* | 3/2006 | Huang | 382/254 |
| 2006/0273792 A1* | 12/2006 | Kholmovski et al. | 324/309 |
| 2006/0284812 A1* | 12/2006 | Griswold et al. | 345/92 |
| 2007/0090838 A1* | 4/2007 | Hennig | 324/307 |
| 2007/0096732 A1* | 5/2007 | Samsonov et al. | 324/309 |
| 2007/0219740 A1* | 9/2007 | Wilson et al. | 702/85 |
| 2008/0024132 A1* | 1/2008 | Brau et al. | 324/309 |
| 2008/0048659 A1* | 2/2008 | Reeder | 324/312 |
| 2008/0278160 A1* | 11/2008 | Griswold et al. | 324/307 |
| 2009/0134872 A1* | 5/2009 | Brau et al. | 324/309 |
| 2009/0224759 A1* | 9/2009 | Kholmovski et al. | 324/310 |
| 2010/0239142 A1* | 9/2010 | Dannels et al. | 382/131 |
| 2011/0084693 A1* | 4/2011 | Kholmovski et al. | 324/310 |
| 2011/0234223 A1* | 9/2011 | McColl et al. | 324/309 |

OTHER PUBLICATIONS

Kholmovski et al., "Garse: Generalized Autocalibrating Reconstruction for Sensitivity Encoded MRI,", Abstract for the Thirteenth Meeting of the International Socieity for Magnetic Resonance in Medicine, Proc. Intl. Soc. Mag. Reson. Med., (2005), p. 2672, vol. 13.

* cited by examiner

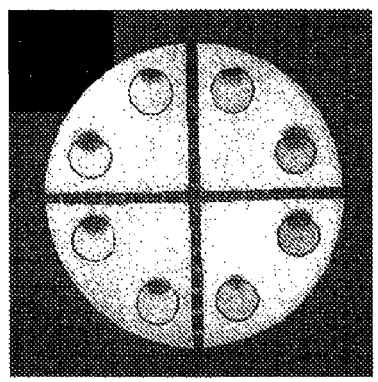 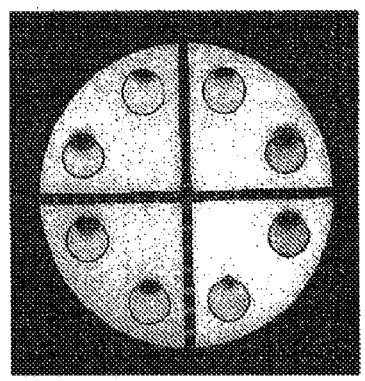
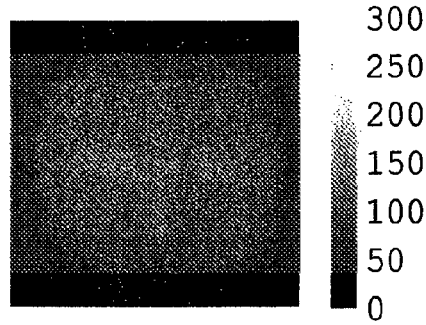 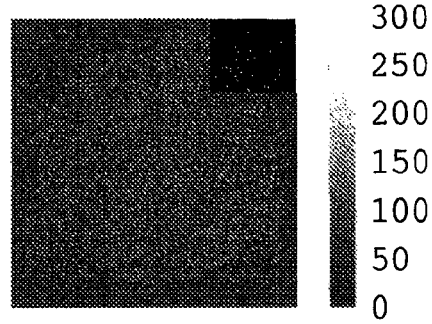
*FIG. 7A*        *FIG. 7B*
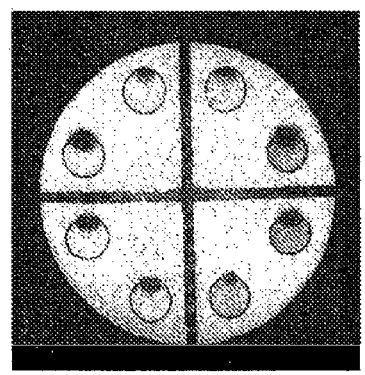 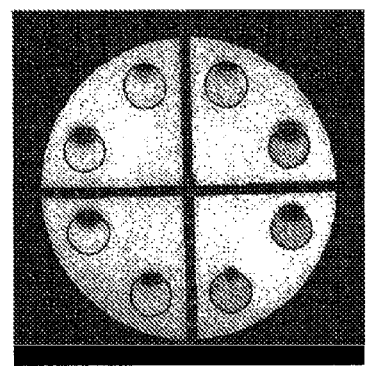
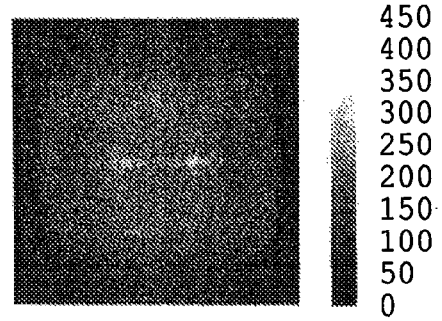 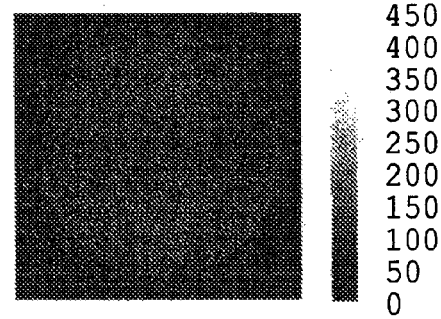
*FIG. 7C*        *FIG. 7D*

SYSTEMS AND METHODS FOR IMAGE RECONSTRUCTION OF SENSITIVITY ENCODED MRI DATA

CROSS-REFERENCE TO RELATED APPLICATIONS

This application is a continuation of U.S. application Ser. No. 12/414,632, filed Mar. 30, 2009, which is a continuation of U.S. application Ser. No. 11/412,073, filed Apr. 25, 2006, now U.S. Pat. No. 7,511,495, issued Mar. 31, 2009, which claims the priority benefit under 35 U.S.C. §119(e) of U.S. Provisional Patent Application No. 60/675,002, filed on Apr. 25, 2005, and U.S. Provisional Patent Application No. 60/773,373, filed on Feb. 14, 2006. Each of the aforementioned patent applications is hereby incorporated by reference herein in its entirety.

STATEMENT REGARDING FEDERALLY SPONSORED R&D

This invention was made with government support under Contract Numbers R01HL53596, R01EB177-02, R01HL57990, and R01HL48223 awarded by the National Institutes of Health. The government has certain rights to this invention.

BACKGROUND

1. Field of the Invention

The present disclosure relates to magnetic resonance imaging (MRI) methods, and more particularly to MRI image reconstruction methods.

2. Description of the Related Art

Magnetic resonance imaging ("MRI") is an important diagnostic and imaging technique for targets such as a human body. MRI techniques are based on the absorption and emission of radio frequency ("RF") energy by the nuclei of atoms. Typically, the target is placed in a strong magnetic field that causes the generally disordered and randomly oriented nuclear spins of the atoms to become aligned with the applied magnetic field. One or more RF pulses are transmitted into the target, perturbing the nuclear spins. As the nuclear spins relax to their aligned state, the nuclei emit RF energy that is detected by receiving coils disposed about the target. The received RF energy is processed into a magnetic resonance ("MR") image of a portion of the target.

By utilizing nonuniform magnetic fields having gradients in each of the three spatial dimensions, the location of the emitting nuclei can be spatially encoded so that the target can be imaged in three dimensions ("3-D"). It is common to refer to the direction of a "slice" in the target as the z-direction and the two mutually orthogonal directions in the plane of the slice as the x- and y-directions. Generally, RF pulses having a range of frequencies are transmitted into the target, and by using well-known frequency encoding (e.g., for the x-direction) and phase encoding techniques (e.g., for the y-direction), a set of MRI data is received by each of the receiver coils for each slice in the target. The MRI data are a Fourier representation (e.g., frequency domain) of the nuclear emissions from the target, and an image of the slice of the target is obtained by performing a Fourier transformation of the frequency domain MRI data. In MRI systems having multiple receiver coils (parallel MRI), an image is reconstructed from each receiver coil, and a final image is a combination of the images from each coil. Multiple receiver coil systems can be used to achieve high spatial and temporal resolution, to suppress image artifacts, and to reduce MRI scan time.

MRI data in the phase encoding direction can be acquired at the appropriate Nyquist sampling rate to avoid artifacts in the final image caused by aliasing. However, sampling at the Nyquist rate is time consuming and can prevent imaging targets that move (e.g., a beating heart). Recent methods of parallel or partially-parallel MRI ("P-MRI") therefore undersample the phase encoding dimension (as compared to Nyquist sampling) by a reduction factor R (which may be 2, 3, 4, or more) in order to decrease data acquisition time. The undersampling results in certain data in k-space not being acquired, and therefore not available for image reconstruction. However, dissimilarities in the spatial sensitivities of the multiple receiver coils provide supplementary spatial encoding information, which is known as "sensitivity encoding." Some of the P-MRI methods are able to reconstruct values for the unacquired data by combining undersampled, sensitivity-encoded MRI data received by different coils. By combining the acquired data and the reconstructed values of the unacquired data, a fully sampled set of k-space MRI data is produced that can be used to create a final image with reduced aliasing artifacts. Typically, parallel imaging methods reconstruct the unacquired data from the acquired data, whereas "partially" parallel imaging methods acquire additional auto-calibration signal ("ACS") data to assist in the reconstruction.

Although, some P-MRI methods have produced good-quality images from MRI data acquired at lower reduction factors, many of the present P-MRI methods suffer from strong noise amplification and non-resolved aliasing artifacts when the MRI data is acquired at higher reduction factors. Moreover, certain P-MRI methods require time-consuming calibration scans that can provide erroneous data due to, for example, target motion between the calibration scan and the imaging scan.

SUMMARY

An embodiment of a method for reconstructing an image from sensitivity encoded magnetic resonance imaging (MRI) data capable of being represented in a frequency domain is disclosed. The frequency domain comprises at least a first frequency dimension and a second frequency dimension, and the first and second frequency dimensions correspond to a first spatial dimension and a second spatial dimension. The method comprises, based on a reduced MRI data set, acquired from each of two or more receiver coils, the reduced MRI data set configured to be represented in a first portion of the frequency domain, wherein the MRI data set is undersampled in at least the first frequency dimension, determining reconstruction coefficients for each of the two or more receiver coils. The reconstruction coefficients are spatially-varying with respect to at least the second spatial dimension. The method further comprises determining a reconstructed MRI data set, which is configured to be represented in a second portion of the frequency domain, for each of the two or more receiver coils by combining the reconstruction coefficients and the reduced MRI data set from at least one of the two or more receiver coils. The second portion comprises representative locations in the frequency domain wherein the reduced MRI data set has not been acquired. The method further comprises determining a complete MRI data set for each of the two or more receiver coils by combining the reduced MRI data set and the reconstructed MRI data set, and outputting at least a portion of the complete MRI data set to an output device.

Another embodiment of a method for reconstructing an image from magnetic resonance imaging (MRI) data capable of being represented in a k-space having at least two dimensions is disclosed. The method comprises, based on image data for a portion of the k-space from at least a plurality of coils, the portion of k-space wherein the image data is acquired being undersampled in at least a first dimension of the k-space, identifying a location in the k-space where no image data has been acquired for at least a first coil in the plurality of coils. The method further comprises reconstructing a value of the image data at the identified location for at least the first coil by linearly combining a portion of the acquired image data from at least one of the plurality of coils. The method further comprises outputting the value to an output device. The combined portion of the acquired image data corresponds to a neighborhood of the identified location in k-space. The neighborhood is proximate the identified location.

An embodiment of a system for reconstructing sensitivity-encoded magnetic resonance (MRI) data from a target is presented herein. The system comprises two or more receiver coils configured to be disposed near the target. The coils are configured to receive from the target acquired MRI data, with the data being representable in an acquired portion of the frequency domain. The frequency domain comprises a first and a second frequency dimension. The system further comprises a sampling module configured to communicate with at least one of the two or more receiver coils so as to receive the acquired MRI data from each of the receiver coils and output undersampled MRI data. The system also comprises an image reconstruction processor configured to identify an unacquired portion of the frequency domain in which the undersampled MRI data has not been acquired. The unacquired portion and the acquired portion may be combined to provide a fully sampled portion of the frequency domain. The image reconstruction processor combines the undersampled MRI data from at least one of the two or more receiver coils to estimate unacquired MRI data in the unacquired portion of the frequency domain. The estimated unacquired MRI data is combined over a neighborhood in the frequency domain. The image reconstruction processor produces image data representing the target using the undersampled MRI data and the estimated unacquired MRI data from at least one of the two or more receiver coils.

Certain embodiments are summarized above. However, despite the foregoing summary of certain embodiments, only the appended claims (and not the present summary) are intended to define the invention(s). The summarized embodiments, and other alternate embodiments and/or uses and obvious modifications and equivalents thereof, will become readily apparent from the following detailed description of certain preferred embodiments having reference to the attached figures. The invention(s) disclosed herein are not limited to any particular embodiment(s) disclosed.

BRIEF DESCRIPTION OF THE DRAWINGS

FIGS. 7A-7D illustrate images reconstructed by a prior art method (GRAPPA) and an embodiment of the present method (upper images), and images showing the magnitude of the difference between the reconstructed image and the true image (lower images).

DETAILED DESCRIPTION OF CERTAIN PREFERRED EMBODIMENTS

For convenience and ease of presentation only, the following detailed description is generally directed to systems and methods for two-dimensional ("2-D") [e.g., (x,y)] image reconstruction from 2-D Cartesian k-space [e.g., $(k_x,k_y)$] MRI data. However, this is not a limitation on the systems and methods disclosed herein, and certain embodiments of the invention are directed toward 3-D [e.g., (x,y,z)] image reconstruction from 3-D Cartesian k-space [e.g., $(k_x,k_y,k_z)$] MRI data. The systems and methods disclosed herein can also be applied to parallel or partially parallel MRI systems with undersampling in more than one phase encoding direction (e.g., $k_y,k_z$). Accordingly, it is understood that the systems and methods disclosed herein are general in nature and are not limited to the 2-D Cartesian embodiments shown and described for illustrative and/or example purposes.

Figure 1:
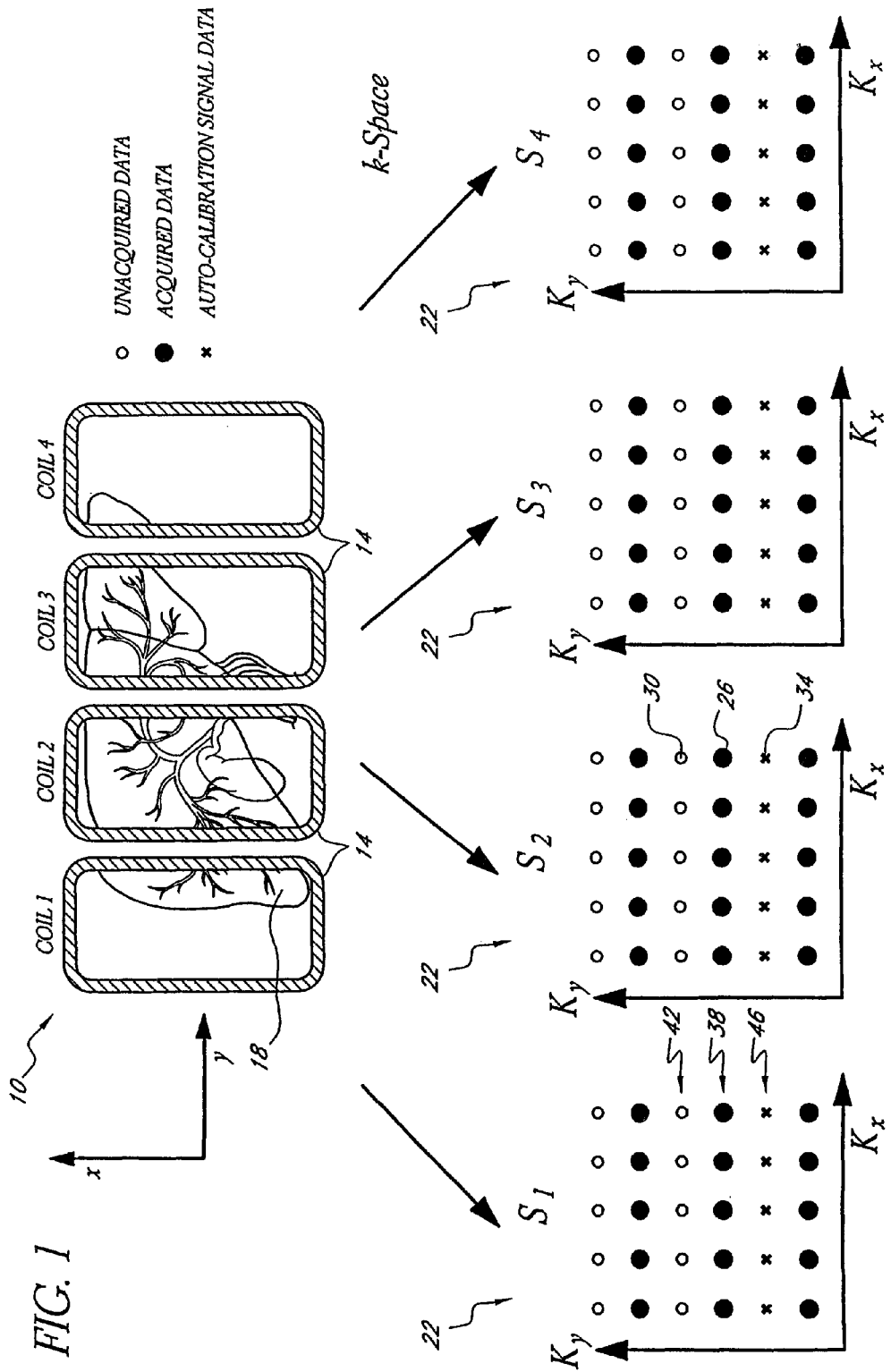
FIG. 1 schematically illustrates acquisition of k-space MRI data from multiple receiver coils.

FIG. 1 schematically illustrates acquisition of frequency domain MRI data in a parallel MRI system 10 having multiple receiver coils 14. Although four receiver coils 14 are illustrated in FIG. 1, this is not a limitation, and any number of coils can be used such as, for example, 2, 3, 4, 8, 16, 32, or more coils. The MRI system 10 is used to image a target 18, which may include a portion or all of a body. MRI data is acquired in a frequency domain that is commonly referred to as "k-space," with $k_x$ corresponding to the x-direction and $k_y$ corresponding to the y-direction. In many conventional MRI systems, data in the x-direction is frequency encoded, and data in the y-direction is phase encoded. The 2-D MRI data in k-space is generally acquired by sampling in the $k_x$ and the $k_y$ dimensions (for example, by sampling each dimension at 128 or 256 data points or pixels). To avoid aliasing artifacts in the phase encoded direction, the sampling rate in $k_y$ can correspond to the Nyquist sampling rate. However, since Nyquist sampling is time consuming, many MRI systems undersample in the phase encoding direction by a reduction factor R.

Embodiments of parallel or partially parallel MRI systems may also include a sampling module that is configured to communicate with the receiver coils. The sampling module may perform functions such as, for example, receiving the acquired MRI data from each of the receiver coils and outputting undersampled MRI data to other components of the MRI system such as, for example, processors or output devices. Many possible output devices can be used in MRI systems. As used herein, the term "output device" is a broad term and includes devices, systems, apparatus, or components of the MRI system that can store or output information, data, results, calculations, etc. For example, an output device can include volatile and nonvolatile memory, random access memory ("RAM"), read-only memory ("ROM"), hard drives, optical drives, magnetic drives, displays, monitors, printers, voice and sound output devices, the human voice, and any other suitable storage or output apparatus or system.

FIG. 1 schematically illustrates the k-space sampling of MRI data from each of the coils in the case where the reduction factor R=2, e.g., every other line of data needed to achieve Nyquist sampling in the $k_y$ direction is unacquired (or omitted) by the MRI system 10. The k-space data from the i-th coil is denoted as $S_i(k_x, k_y)$, where the integer index i runs from 1 to the number of coils $N_c$. In the embodiment shown in FIG. 1, $N_c$=4, and, for example, the MRI data acquired by the third coil is $S_3(k_x, k_y)$. FIG. 1 also illustrates k-space graphs 22 (e.g., $k_y$ versus $k_x$) that schematically represent possible sampled MRI data points. Acquired data (e.g., RF signals actually received by the coils 14) are represented by filled circles 26; unacquired data by open circles 30; and, auto-calibration signal ("ACS") data are represented by crosses 34. In various embodiments, the ACS data 34 can be taken at any one or more suitable locations in k-space; FIG. 1 schematically illustrates one ACS line 38 between two acquired lines 42 and 46.

FIG. 1 schematically shows that the MRI data typically is also sampled in the readout direction, $k_x$. In certain embodiments, for each line of phase encoded data (e.g., for each acquired $k_y$ line), the frequency encoded direction $k_x$ is sampled at the appropriate Nyquist rate to avoid aliasing artifacts in the x-direction of the image. Accordingly, for a complete MRI data set (e.g., Nyquist sampled), each of the points in the graphs 22 would correspond to acquired data (e.g., the points would be represented by filled circles 26). As shown in FIG. 1, undersampling in the phase encoding direction at a reduction factor of R=2 results in every other $k_y$ line being acquired; undersampling at a reduction factor of R=3 would result in every third $k_y$ line being acquired, etc. In various embodiments, parallel or partially parallel reconstruction methods utilize the acquired data and/or the ACS data to reconstruct values for the unacquired data (e.g., the open circles 30). The combination of the acquired MRI data and the reconstructed values of the unacquired MRI data provide a Nyquist sampled set of data for image reconstruction by a Fourier transformation. In some embodiments, unacquired data are reconstructed with acquired (and/or ACS) data from some or all of the other coils in the MRI system 10.

In parallel MRI ("P-MRI") techniques, an array of multiple simultaneously operated receiver coils is used for RF signal acquisition. The receiver coils typically exhibit inhomogeneous (and usually mutually distinct) spatial sensitivities. Coil sensitivity effectively encodes spatial information on the acquired MRI signals. MRI imaging methods can use this sensitivity encoded MRI data to assist in the reconstruction of unacquired data and to provide a final MR image of the target. P-MRI systems.

An image $s_i(r)$ acquired by i-th coil element can be described by the relationship $$s_i(r) = c_i(r) f(r), \quad (1)$$

where f(r) represents the imaged target and $c_i(r)$ represents the i-th coil sensitivity (where $1 \leq i \leq N_c$, the number of receiver coils). By Fourier transforming to k-space (the frequency domain), Equation (1) becomes $$S_i(k) = C_i(k) \otimes F(k) \quad (2)$$

where the symbol $\otimes$ denotes convolution. In Equation (2), Fourier transforms of variables in Equation (1) are denoted by capital letters, e.g., $S_i(k)$ is the Fourier transform of the image $s_i(r)$. As discussed above, for simplicity of presentation only, embodiments of the systems and methods for image reconstruction will be described for the case of 2-D imaging (e.g., where r=(x,y) and k=($k_x, k_y$)) with data undersampling along the phase encoding dimension, $k_y$. Embodiments for 3-D imaging and/or for undersampling in two phase-encoding dimensions (e.g., $k_y$ and $k_z$) readily follow from the discussion herein.

For embodiments in which the $k_x$ direction is Nyquist sampled, a Fourier transform along $k_x$ can be used to reconstruct the intermediate image estimate for the i-th coil:

$$S_{x,i}(k_y) = C_{x,i}(k_y) \otimes_{k_y} F_x(k_y) \quad (3)$$

where the index x runs from 1 to the number of pixels $N_x$ spanning the image field-of-view ("FOV") in the x (e.g., readout) direction. The operator $\otimes_{k_y}$ represents a convolution with respect to $k_y$ only. Equation (3) demonstrates that embodiments of a 2-D, P-MRI reconstruction method for data acquisition on a regular Cartesian grid can be subdivided into $N_x$ individual one-dimensional reconstructions. Equation (3) can be expressed in matrix form as $$S_{x,i} = C_{x,i} F_x \quad (4)$$

for the i-th coil dataset. Combining the $N_c$ coil Equations (4), a matrix equation governing P-MRI image reconstruction can be expressed as $$S_x = C_x F_x \quad (5)$$

In MRI systems 10 using k-space undersampling, the acquired MRI data forms a reduced data set that does not provide Nyquist sampling (in at least the $k_y$ direction). In the case of undersampling, the vector $S_x$ and the matrix $C_x$ can be represented as $$S_x = \begin{bmatrix} \tilde{S}_x \\ \hat{S}_x \end{bmatrix} \text{ and } C_x = \begin{bmatrix} \tilde{C}_x \\ \hat{C}_x \end{bmatrix} \quad (6)$$

where $\tilde{S}_x$ denotes a vector of the acquired data and $\hat{S}_x$ denotes a vector of unacquired data. The matrices $\tilde{C}_x$ and $\hat{C}_x$ are the corresponding acquired and unacquired sub-blocks of the matrix $C_x$. A system of two matrix equations with unknowns $F_x$ and $\hat{S}_x$ can be derived from Equation (6) as $$\tilde{S}_x = \tilde{C}_x F_x$$

$$\hat{S}_x = \hat{C}_x F_x \quad (7)$$

The solution to the system (7) can be found when a pseudo-inverse of the matrix $\tilde{C}_x$ exists. The solution is given by $$F_x = (\tilde{C}_x^H \psi^{-1} \tilde{C}_x)^{-1} \tilde{C}_x^H \psi^{-1} \tilde{S}_x$$

$$\overline{S}_x = A_x \overline{S}_x \quad (8)$$

where the matrix $A_x$ is defined as $$A_x = \hat{C}_x (\tilde{C}_x^H \psi^{-1} \tilde{C}_x)^{-1} \tilde{C}_x^H \psi^{-1} \quad (9)$$

The superscript H denotes a Hermitian conjugate (e.g., a transposed complex conjugate matrix). The matrix $\psi$ is a receiver noise matrix that describes the coupling and noise correlation between the receiver coils. The first expression in Equation (8) describes image reconstruction from the undersampled P-MRI data when the coil sensitivities are known. The second expression in Equation (8) shows that unacquired data $\hat{S}_x$ for individual coil datasets can be reconstructed by linearly combining the acquired data according to $$S_i(x, \hat{k}_y) = \sum_{j=1}^{N_c} \sum_{\tilde{k}_y} a(i, j, x, \tilde{k}_y) S_j(x, \tilde{k}_y) \tag{10}$$

where $\tilde{k}_y$ denotes the acquired, and $\hat{k}_y$ denotes the unacquired, phase-encoded views. Equation (10) shows that the unacquired data is a linear combination of the acquired data from all the $N_c$ coils and from all of the acquired $\tilde{k}_y$ views. Additionally, Equation (10) shows that the reconstruction coefficients $a(i,j,x,\hat{k}_y)$ for coil i depend on the other coils (j), a coordinate in a non-phase-encoding direction (e.g., x), as well as the acquired $\tilde{k}_y$ views.

The coil sensitivities, $c_i(r)$, which generally are relatively slowly varying in image space, can generally be adequately described by a relatively small number of low-frequency Fourier terms, e.g., the coil sensitivities generally have compact support in k-space. Accordingly, correlations between k-space samples decay relatively quickly with increasing distance in k-space. Consequently, in certain preferred embodiments, the unacquired data $S_i(x,\hat{k}_y)$ is reconstructed using acquired data $S_j(x,\tilde{k}_y)$ from k-space locations in a neighborhood of $\hat{k}_y$. The reconstruction of the unacquired data can be represented in certain such embodiments according to a linear combination $$S_i(x, \hat{k}_y) = \sum_{j=1}^{N_c} \sum_{\tilde{k}_y \in \Omega(x,\hat{k}_y)} a(i, j, x, \tilde{k}_y) S_j(x, \tilde{k}y) \tag{11}$$

where $\Omega_j(x,\hat{k}_y)$ denotes a neighborhood of the unacquired $(x,\hat{k}_y)$ point, which includes a number of the sampled $(x,\tilde{k}_y)$ points that are used to reconstruct the unacquired sample point $(x,\hat{k}_y)$. The extent of any of the neighborhoods $\Omega_j(x,\hat{k}_y)$ can be determined by accounting for MRI system properties such as, for example, imaging geometry, coil sensitivity characteristics, and/or the undersampling (reduction) factor of the MRI data acquisition process. Embodiments of systems and methods according to Equation (11) will be referred to as "mixed" systems and methods, because the reconstruction coefficients and the neighborhoods depend at least on a spatial dimension (e.g., the x-direction corresponding to the frequency encoded) and a frequency dimension (e.g., the phase encoded $k_y$ direction).

In certain embodiments for 3-D imaging wherein two phase-encoding directions are undersampled, the neighborhoods depend on one spatial coordinate (e.g., the x-direction) and the phase-encoding directions according to, for example, $\Omega_j(x,\hat{k}_y,\hat{k}_z)$. The one spatial coordinate corresponds to the non-phase-encoded direction (e.g., a frequency encoded direction). In other embodiments for 3-D imaging wherein one phase-encoding direction is undersampled, the neighborhoods depend on two spatial coordinates corresponding to the non-phase-encoded directions according to, for example, $\Omega_j(x,\hat{k}_{y,z})$ or $\Omega_j(x,y,\hat{k}_z)$. Accordingly, in these embodiments, reconstruction of the unacquired data includes information on the variation of coil sensitivities in all three spatial dimensions. The extent of the neighborhoods in general depends on imaging geometry, characteristics of the j-th coil, one or more spatial dimensions corresponding to non-phase-encoded directions (e.g., the x-direction), and the reduction factor R used for the acquisition of the acquired k-space points in the vicinity of $\hat{k}_y$. In various embodiments, the extents of the neighborhoods $\Omega_j(x,\hat{k}_y)$ are selected to suppress image artifacts from the undersampling, to minimize reduction in signal-to-noise ratio ("SNR"), and/or to reduce computational time needed for the image reconstruction. In certain embodiments, the extents of the neighborhoods $\Omega_j(x,\hat{k}_y)$ are selected based on the geometry of the coils and their orientation relative to an imaging axis. The systems and methods disclosed herein are named "GARSE," which stands for Generalized Auto-calibrating Reconstruction for Sensitivity Encoded MRI.

In certain embodiments, the systems and methods disclosed herein can be implemented in k-space. In these "k-space" embodiments, an analysis generally similar to that of Equations (1)-(11) demonstrates that the unacquired MRI data can be reconstructed from the acquired MRI data according to $$S_i(\hat{k}) = \sum_{j=1}^{N_c} \sum_{\tilde{k} \in \Omega(\hat{k})} a(i, j, \hat{k}) S_j(\tilde{k}) \tag{12}$$

In Equation (12), $\tilde{k}$ denotes the k-space positions of the acquired MRI data, and $\hat{k}$ denotes the k-space positions of the unacquired k-space samples. Because coil sensitivities are generally slowly varying functions of spatial position and may be described by a relatively small number of Fourier frequencies (e.g., the coil sensitivities have relatively limited support in k-space), the neighborhoods $\Omega_j(\hat{k})$ used in the linear combination in Equation (12) generally are relatively limited regions in the vicinity of the unacquired k-space point $\hat{k}$. In some P-MRI systems in which k-space sampling is performed on a regular Cartesian grid, the reconstruction coefficients $a(i,j,\hat{k})$ may generally have about the same value for most unacquired positions $\hat{k}$, and the reconstruction coefficients can be evaluated from ACS data via many possible methods. In various embodiments, the neighborhood $\Omega_j(\hat{k})$ is defined by accounting for the given geometry of the coil and its orientation relative to an imaging axis. In certain preferred implementations, "mixed" systems and methods based on Equation (11) are more computationally efficient than "k-space" systems and methods based on Equation (12), although similar image quality is achievable for embodiments of both approaches.

Figure 2:
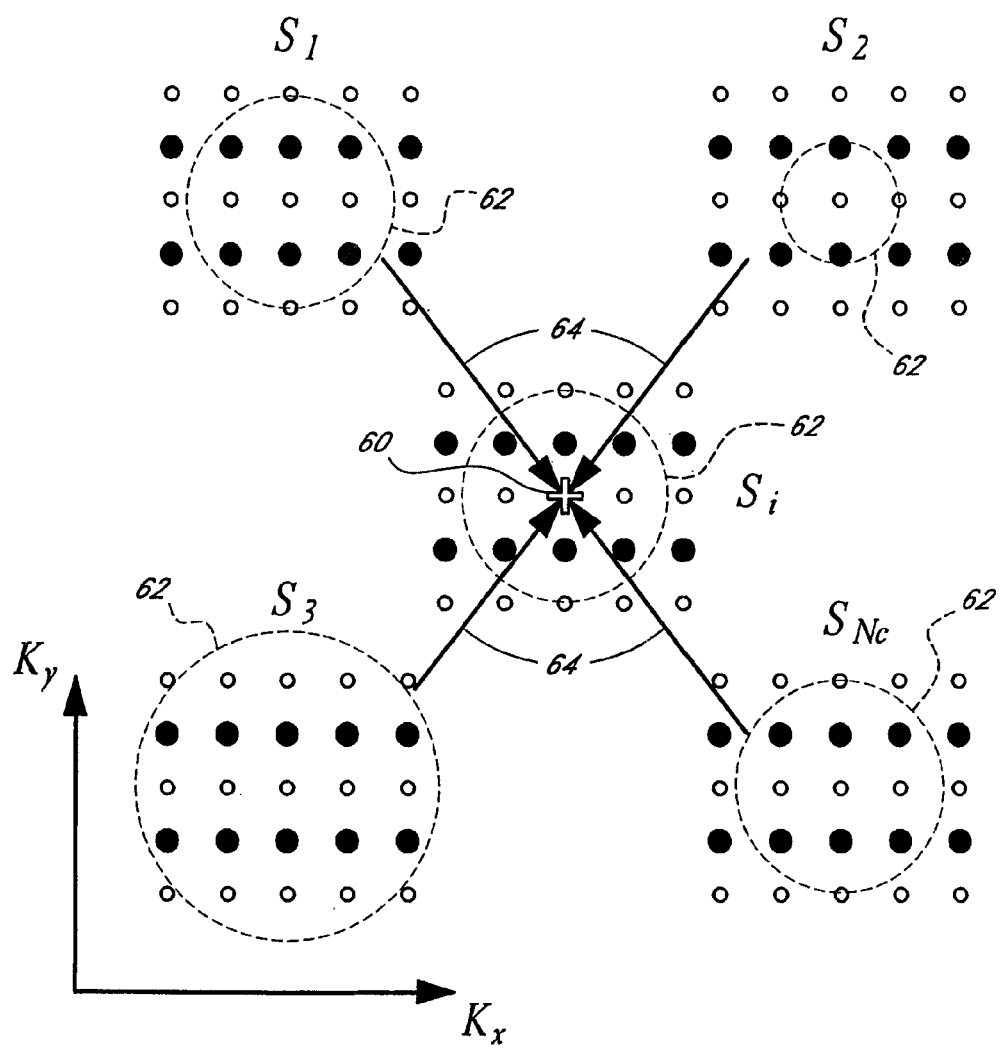
FIG. 2 schematically illustrates an embodiment of a method for 2-D image reconstruction from sensitivity-encoded MRI data.

FIG. 2 schematically illustrates an embodiment of a k-space method according to Equation (12) for 2-D reconstruction of unacquired data from undersampled, sensitivity-encoded MRI data. The sampled points in k-space are shown using the same symbol types used in FIG. 1: filled circles represent acquired MRI data and open circles represent unacquired MRI data (the filled boxes will be discussed below). Although FIG. 2 does not show ACS data (e.g., crosses), such ACS data points can be thought of as comprising some or all of the filled circles. MRI data from different receiver coils is illustrated (e.g., coils $S_1$, $S_2$, $S_3$, $S_i$, and $S_{N_c}$, where as discussed above, the number of coils $N_c$ can be arbitrary). FIG. 2 schematically illustrates that the value of the unacquired data at a point 60 (marked by a + sign) in the i-th coil, can be reconstructed as a linear combination of the acquired data from suitable k-space neighborhoods, $\Omega_j(\hat{k})$, in each of the coils. Arrows 64 indicate that the acquired (and/or ACS) data within the neighborhoods $\Omega_j(\hat{k})$ are used in the reconstruction of the value at the point 60.

Dashed circles 62 in FIG. 2 schematically represent the neighborhoods $\Omega_j(\hat{k})$ used for the reconstruction of unacquired MRI data according to Equation (12). The different diameters of the circles 62 in FIG. 2 schematically indicate that the extent of the neighborhood for each coil can be a function of local characteristics of the MRI system. Although depicted as circles 62 in FIG. 2, the neighborhoods $\Omega_j(\hat{k})$ can have any suitable shape and/or size (including zero size) so as to produce desired imaging results. In many embodiments, the neighborhoods have at least a two-dimensional extent in k-space, e.g., the neighborhoods comprise a region extending in both the $k_y$ and the $k_x$ directions. For example, the neighborhoods generally encompass an area in k-space that comprises at least a portion of the ($k_x,k_y$) plane (e.g., areas within the dashed circles 62 of FIG. 2). Further, the extent of the neighborhoods $\Omega_j(\hat{k})$ can depend on the distance between the sample to be reconstructed, $S_j(\hat{k})$ and the center of k-space.

The extent of the neighborhoods advantageously can be adjusted to provide improved reconstruction of the unacquired MRI data. Further details regarding the selection of the neighborhoods are discussed below with reference to FIGS. 3B and 3C. In certain embodiments it is beneficial to exclude from the linear combination in Equation (11) contributions from coils that have low and/or nearly constant sensitivity along the y-direction at certain x-coordinates. These coil contributions can readily be excluded, for example, by setting the extent of the corresponding neighborhoods $\Omega_j(x,\hat{k}_y)$ to be equal zero at the appropriate x-coordinates, thereby eliminating the MRI data $S_j(x,\tilde{k}_y)$ from the summation in Equation (11). Additionally, MRI data that is statistically insignificant, has large errors, and/or is from outlier coils may also be excluded from the linear combination to improve the reconstruction of the unacquired data. In certain preferred embodiments, the extent of the neighborhoods $\Omega_j(x,\hat{k}_y)$ and $\Omega_j(\hat{k})$ can also depend on a nonexclusive list of factors such as the distance between the k-space location of the sample to be reconstructed and the center of k-space, the magnitude of the acquired MRI data (or an image derived from the data) as compared to various threshold values, and/or a signal-to-noise ratio of the MRI data (or images derived therefrom).

In embodiments of the "mixed" systems and methods, as can be seen from Equation (11), the reconstruction coefficients $a(i,j,x,\hat{k} y)$ (as well as the neighborhoods $\Omega_j(x,\hat{k}_y)$) are spatially variable and change in the x-direction (e.g., the frequency encoding direction) according to local receiver coil characteristics. Accordingly, reconstruction methods according to Equation (11) can better account for inhomogeneity, geometry, and orientation of the receiver coils so as to generate more trustworthy image reconstructions as compared to other MRI image reconstruction methods.

As an illustrative example, the present systems and methods are compared to the widely-used GRAPPA ("GeneRalized Autocalibrating Partially Parallel Acquisitions) algorithm, described in U.S. Pat. No. 6,841,998, MAGNETIC RESONANCE IMAGING METHOD AND APPARATUS EMPLOYING PARTIAL PARALLEL ACQUISITION, WHEREIN EACH COIL PRODUCES A COMPLETE K-SPACE DATASHEET, issued Jan. 11, 2005, which is hereby incorporated by reference herein in its entirety. In the GRAPPA method, both the reconstruction coefficients and the neighborhoods used in the reconstruction are spatially invariant and independent of the frequency encoding direction (e.g., the x-coordinate). The GRAPPA reconstruction method provides optimal images only in the non-physical case where the coil sensitivities are independent of the frequency encoding direction (e.g., the x-direction), while embodiments of the present systems and methods recognize that receiver coil sensitivities are spatially-varying in three dimensions and therefore incorporate from all three spatial directions as appropriate. Additionally, in the GRAPPA method, the dimensionality of the neighborhoods used in the reconstruction of the unacquired data is defined by the undersampling direction, whereas in the present systems and methods all directions are used. For example, if the MRI data is undersampled in one phase encoding direction, the GRAPPA method uses neighborhoods that are one-dimensional in the phase encoding direction. In contrast, in such a case, the present systems and methods utilize two dimensional neighborhoods that account for the phase encoding direction as well as the frequency coding direction. Accordingly, the present systems and methods can account for non-zero correlations of the receiver coil characteristics in all directions.

Embodiments of the present systems and methods more accurately reflect the spatial complexity of receiver coil sensitivities than the GRAPPA method. Therefore, unlike certain embodiments of the present systems and methods, the GRAPPA method can suffer from strong noise amplification, reduced signal-to-noise ratio, and non-resolved aliasing artifacts when the MRI data is acquired at higher sampling reduction factors. Embodiments of the present systems and methods advantageously exploit MRI data from all spatial dimensions to provide more robust reconstruction coefficients beneficially yielding images with improved quality, increased signal-to-noise, and significantly suppressed residual aliasing artifacts, especially at larger reduction factors.

Figure 3A:
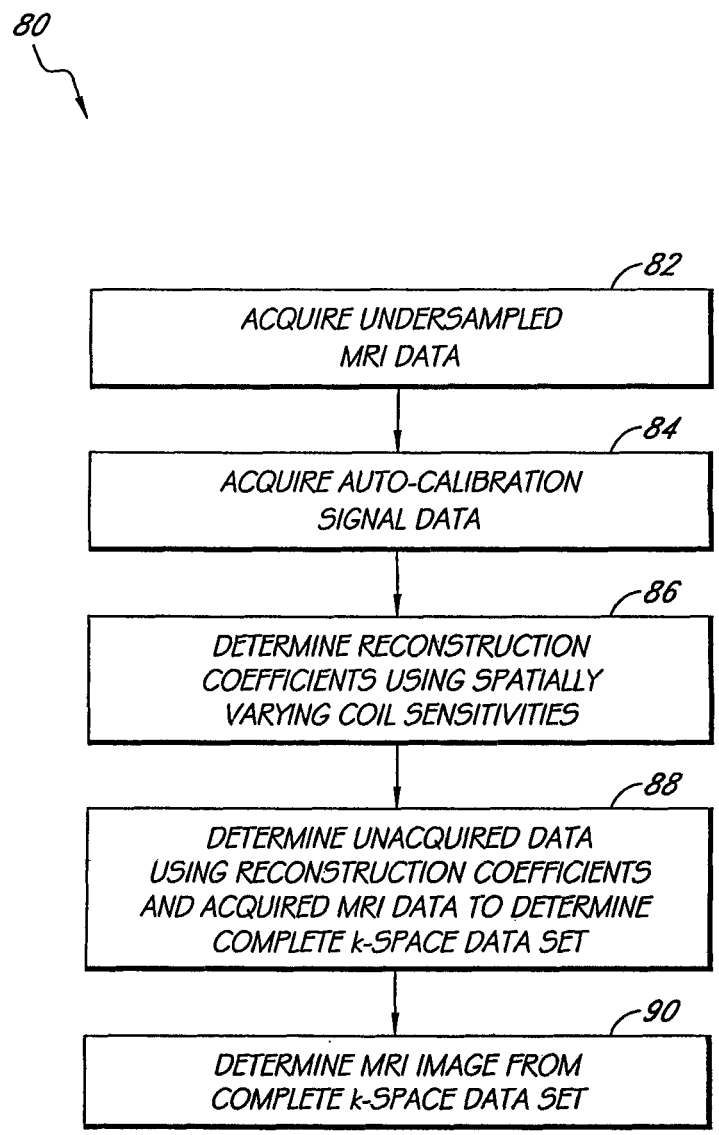
FIG. 3A is a flowchart that illustrates an embodiment of a method for reconstructing an image from undersampled, sensitivity-encoded MRI data.

FIG. 3A is a flowchart that illustrates an embodiment of a method 80 for reconstructing an image from undersampled, sensitivity-encoded MRI data according to the "mixed" systems and methods of the present disclosure. In block 82, MRI data $\tilde{S}_{x,i}$ acquired for each of the $N_c$ coils. Typically, the acquired data is undersampled in the phase-encoding direction (e.g., the y-direction) by a reduction factor R. The reduction factor can be R=2, 3, 4, 5, 6, or more in various embodiments. In block 84, auto-calibration signal ("ACS") data is acquired for one or more k-space lines. In certain embodiments, the ACS data is used in block 84 to estimate the reconstruction coefficients used in the reconstruction of the unacquired data $\hat{S}_{x,i}$. The acquisition of undersampled MRI data (e.g., block 82) need not precede the acquisition of ACS data (e.g., block 84), and in some embodiments both the acquired and ACS data are taken as part of the same MRI data set. For example, in certain preferred embodiments, data in a central region of k-space is acquired with Nyquist sampling and is used as the ACS data, whereas the acquired MRI data in outer k-space regions are undersampled by the reduction factor R.

In block 86, the reconstruction coefficients $a(i,j,x,\tilde{k}_y)$ are determined from the ACS data (block 84) and the acquired MRI data (block 82). In some embodiments, the reconstruction coefficients are determined as best fit parameters that relate the acquired MRI data to the ACS data. For example, the ACS data can be used as the left-hand-side of Equations (11) or (12), the acquired MRI data can be substituted into the right-hand-side of these equations, and the reconstruction coefficients can be determined via a least-squares, a weighted least-squares, or a robust least-squares technique. Methods for determining the neighborhoods used in the reconstruction are described further with reference to FIGS. 3B and 3C. Methods for determining the reconstruction coefficients will be described further below with reference to FIGS. 4-5B.

In block 88, the unacquired data for each of the coils $\hat{S}_{x,i}$ are determined from the reconstruction coefficients, $a(i,j,x,\hat{k}_y)$, and the acquired data according to, for example, Equations (11) or (12). As discussed further below, the neighborhoods $\Omega_j(x,k\vec{r}_y)$ used in the reconstruction can be selected, for example to suppress image artifacts from the undersampling, to minimize reduction in the signal-to-noise ratio due to data undersampling, and/or to reduce computational time needed to generate the image reconstruction. A complete k-space data set for each coil is determined in block 88 by combining the acquired and the reconstructed unacquired data for each coil. In block 90, the complete k-space MRI data is used to determine an MRI image of the target. In various embodiments, many well-known methods can be used to generate the MRI image. For example, in some embodiments, $N_c$ images of the target are generated from the complete MRI data set from each of the $N_c$ coils. The image can be generated by performing a Fourier transformation of the k-space data as is well known. Subsequently, these $N_c$ coil images can be combined into a final MRI image. In one embodiment, a conventional "sum of squares" reconstruction is used to combine the $N_c$ coil images into the final image, although other optimal and/or adaptive methods are used in other embodiments. Embodiments generally similar to the method shown in FIG. 3A can be used for image reconstruction using "k-space" methods [e.g., Eq. (12)].

In block 88, the unacquired data for each of the coils $\hat{S}_{x,i}$ are determined from the reconstruction coefficients, $a(i,j,x,\hat{k}_y)$, and the acquired data according to, for example, Equations (11) or (12). As discussed further below, the neighborhoods $\Omega_j(x,\hat{k}_y)$ used in the reconstruction can be selected, for example to suppress image artifacts from the undersampling, to minimize reduction in the signal-to-noise ratio due to data undersampling, and/or to reduce computational time needed to generate the image reconstruction. A complete k-space data set for each coil is determined in block 88 by combining the acquired and the reconstructed unacquired data for each coil. In block 90, the complete k-space MRI data is used to determine an MRI image of the target. In various embodiments, many well-known methods can be used to generate the MRI image. For example, in some embodiments, $N_c$ images of the target are generated from the complete MRI data set from each of the $N_c$ coils. The image can be generated by performing a Fourier transformation of the k-space data as is well known. Subsequently, these $N_c$ coil images can be combined into a final MRI image. In one embodiment, a conventional "sum of squares" reconstruction is used to combine the $N_c$ coil images into the final image, although other optimal and/or adaptive methods are used in other embodiments. Embodiments generally similar to the method shown in FIG. 3A can be used for image reconstruction using "k-space" methods [e.g., Eq. (12)].

The neighborhoods $\Omega_j(x,\hat{k}_y)$ for the "mixed" methods and $\Omega_j(\hat{k})$ for the "k-space" methods preferably should have extents that are sufficiently large to provide reliable reconstruction of the unacquired data but that are sufficiently small to reduce computational cost. In some embodiments, a "vicinity criterion" is adopted such that the reconstruction neighborhoods include a predetermined number of sample points corresponding to the acquired data in the vicinity of any unacquired k-space location. For example, in certain embodiments of the "mixed" method, the nearest $N_l$ lines in $k_y$ are selected, where $N_l$ can be, e.g., 2, 3, 4, 8, or any other suitable number. In certain embodiments of the "k-space" method, the nearest $N_s$ sample points to an unacquired k-space location are selected, where $N_s$ can be, e.g., 10, 20, 40, or any other number. However, neighborhoods selected according to the vicinity criterion produce sub-optimal reconstructions, because typical receiver coils used in MRI have non-symmetric signatures in the frequency domain. The vicinity criterion does not incorporate detailed information regarding sensitivity properties of the receiver coils in either the spatial domain or the frequency domain.

Figure 3B:
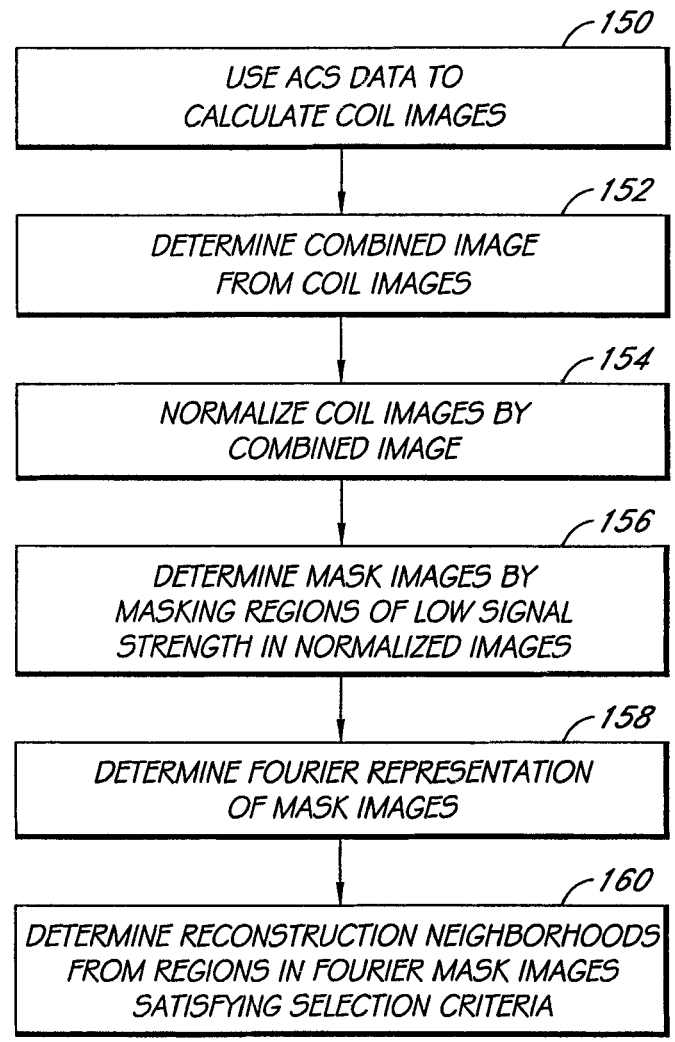
FIG. 3B is a flowchart that illustrates an embodiment of a method for selecting neighborhoods used in reconstructing unacquired MRI data.

FIG. 3B shows a flowchart that describes one embodiment of a method for determining the neighborhoods used in the reconstruction of the unacquired data. In block 150 the ACS data is used to calculate low resolution images for each coil. The low resolution images are denoted as $s_i^{LR}(r)$, where the spatial variable r represents the spatial dimensions in an image slice (e.g., x and y). In block 152, the coil images generated in block 150 are combined to form a combined image. In certain preferred embodiments, the combined image is produced by a sum-of-squares ("SoS") algorithm according to $$s_{SoS}(r) = \sqrt{\sum_{i=1}^{N_c} |s_i^{LR}(r)|^2} .$$

In block 154 the coil images from block 150 are normalized to produced normalized coil images denoted by $v_i(r)$. In certain preferred embodiments, the normalized coil images are calculated according to $v_i(r)=s_i^{LR}(r)/s_{SoS}(r)$. In block 156, mask images $v_i^M(r)$ are produced from the normalized coil images by masking regions of the normalized image that correspond to regions in the combined image that have signal strengths that are below a threshold signal value. For example, in some embodiments, values in the masked regions are set to be zero in signal-free regions of the combined image from block 152:

$$v_i^M(r) = \begin{cases} 0, & r \in \text{signal-free regions} \\ v_i(r), & r \in \text{signal-free regions} \end{cases} \quad (13)$$

Equation (13) represents one possible embodiment for the mask images. In other embodiments, a different masking function can be selected, and the threshold signal value may be nonzero. Many possible choices can be used to mask out regions with sufficiently low signal strength. For example, some embodiments use frequency domain and/or spatial domain filtering to perform the masking function.

In block 158, a frequency domain representation of the mask images $v_i^M(r)$ is produced by, for example, Fourier transformation. In embodiments of the "k-space" method, the Fourier representation is denoted by $V_i^M(k)$, and in embodiments of the "mixed" method, the Fourier representation is denoted by $V_i^M(x,k_y)$. In block 160, the reconstruction neighborhoods are determined from the frequency-domain mask images $V_i^M$ according to one or more selection criteria. In general, the selection criteria are established so that the reconstruction neighborhoods comprise a set of sample points corresponding to sufficiently large magnitudes of $V_i^M$. For example, in some embodiments of the "k-space" method, k-space points are included in the neighborhood $\Omega_k$ if $|V_i^M(k)|>a|V_i^M(0)|$, where a is a small constant factor. In one embodiment, a=0.05, although other values can be used. In certain embodiments, similar selection criteria are used for embodiments of the "mixed" method. In certain such embodiments, phase encoding lines $k_y$ are included in the reconstruction neighborhood $\Omega_j(x,\hat{k}_y)$ if $|V_i^M(x,k_y)|>\beta|V_i^M(x,0)|$, where β is a small constant factor such as, for example, 0.05. Additionally, the neighborhood at an x-position is set to have zero extent if $|V_i^M(x,0)|$ is sufficiently small (e.g., no sample points from this x-position in the i-th coil are included in the reconstruction). This latter criterion can be used to exclude from the reconstruction summation any coils that have low sensitivity for some x-positions.

Figure 3C:
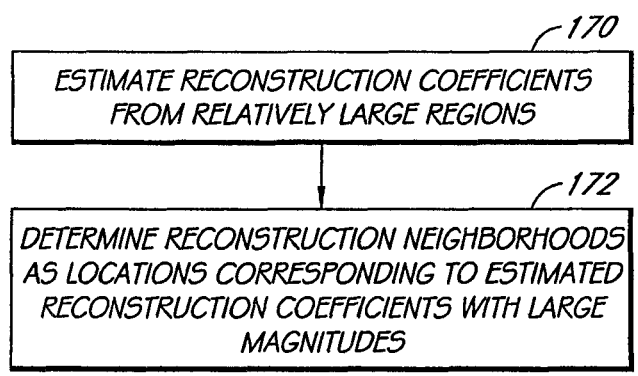
FIG. 3C is a flowchart that illustrates another embodiment of a method for selecting neighborhoods used in reconstructing unacquired MRI data.

FIG. 3C shows a flowchart that illustrates an alternative embodiment of a method for determining the reconstruction neighborhoods. In block 170, reconstruction coefficients are estimated using relatively large neighborhoods in k-space as an initial estimate for the reconstruction neighborhoods. In certain embodiments the relatively large neighborhoods used to generate the estimated reconstruction coefficients are selected by using a vicinity criterion. For example, in a "k-space" method, the relatively large regions may include the $N_s$ points closest to an unacquired k-space location. In some embodiments, $N_s=40$, although other numbers of points can be used. These points generally surround the unacquired k-space location and include points in both the frequency encoding direction (e.g., $k_x$) and the phase encoding direction (e.g., $k_y$). In embodiments for a "mixed" method, the nearest $N_l$ lines of acquired $k_y$ data may be used. In one embodiment, $N_l=8$, although other numbers of lines can be used. In block 172, the reconstruction neighborhoods are determined as the points that correspond to one or more estimated reconstruction coefficients having the largest magnitudes.

In certain preferred embodiments for reconstructing the unacquired data from the ACS data, the neighborhoods $\Omega_j(x,\tilde{k}_y)$ [or $\Omega_j(\tilde{k})$] are determined by, for example, one of the methods discussed above. The reconstruction coefficients $a(i,j,x,\tilde{k}_y)$ [or $a(i,j,\tilde{k})$] are evaluated, and the linear combination in Equation (11) [or Eq. (12)] is calculated. For embodiments of P-MRI systems that utilize undersampling on a 2-D Cartesian grid, the reconstruction coefficients $a(i,j,x,\tilde{k}_y)$ may be the same for all unacquired sample lines, $\hat{k}_y$, and the reconstruction coefficients can be evaluated (or fitted) using a variety of methods. For example, in some embodiments, the GRAPPA fitting procedure using auto-calibrating k-space lines is used. Since ACS data are contaminated with noise, it is preferable, although not necessary, for the fitting procedure to be highly over-determined. The total number of reconstruction coefficients in some embodiments of the present systems and methods is substantially larger than for the GRAPPA method because, for each x-coordinate, the present systems and methods have an independent set of reconstruction coefficients. Therefore, under certain circumstances, fitting the reconstruction coefficients can be numerically ill-determined.

Figure 4:
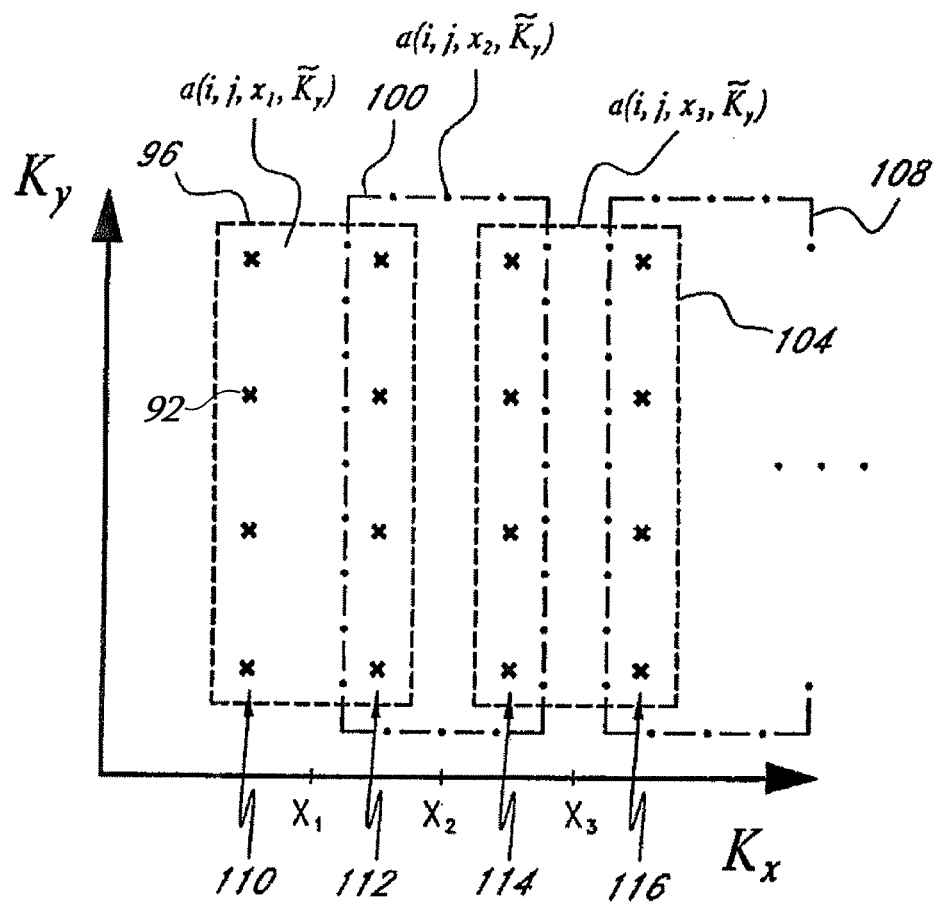
FIG. 4 schematically illustrates an embodiment of a method for determining x-dependent reconstruction coefficients.

Several methods can be used to overcome the possibility of a numerically ill-determined fitting procedure. Because the receiver coil sensitivities generally are relatively slowly varying spatially (e.g., in the image domain), the reconstruction coefficients $a(i,j,x,\tilde{k}_y)$ are also typically slowly varying relative (at least) to the x-coordinate (e.g., the frequency-encoding direction). FIG. 4 schematically illustrates an embodiment of a first method for determining the reconstruction coefficients. FIG. 4 shows the location of a portion of ACS data samples in the $(k_y,x)$ plane. The ACS data samples are taken at points indicated by crosses 92. In this embodiment, the ACS data are divided into sets of overlapping blocks along the x-direction. The overlapping blocks contain two or more columns of "x" data (e.g., columns 110-116). For example, FIG. 4 shows blocks 96, 100, 104, and 108, with each block containing two columns of data (e.g., block 96 contains the columns 110 and 112, block 100 contains the columns 112 and 114, and block 104 contains the columns 114 and 116). In the example shown in FIG. 4, each block contains two columns, although other numbers of columns are used in other embodiments. In FIG. 4, apart from blocks at ends of the data set (e.g., block 96), each column of "x" data is shared in two adjacent overlapping blocks. In other embodiments, overlapping blocks can share more than one column of data.

After dividing the data into overlapping blocks, a set of reconstruction coefficients is determined for each block. For example, FIG. 4 shows that reconstruction coefficients $a(i,j,x_1,\tilde{k}_y)$ are calculated for the block 96 corresponding to x-coordinate $x_1$, reconstruction coefficients $a(i,j,x_2,\tilde{k}_y)$ are calculated for the block 100 corresponding to x-coordinate $x_2$, and so on. In one embodiment the block reconstruction coefficients are calculated by a fitting procedure using a weighted least-squares method. In another embodiment the block reconstruction coefficients are calculated by a fitting procedure using a robust least-squares method. Finally, the reconstruction coefficients $a(i,j,x,\tilde{k}_y)$ at an arbitrary value of the x-coordinate are determined by interpolating in the x-direction among the block reconstruction coefficients. In some embodiments a linear interpolation procedure is used. However, in other embodiments, higher-order polynomial interpolations procedures are used. Further, in certain embodiments, other interpolation procedures are used including splines, Bezier curves, rational interpolation, trigonometric interpolation, etc. Moreover, in certain embodiments, the MRI data are divided into non-overlapping blocks along the x-direction, the fitting coefficients are determined for each non-overlapping block, and interpolation is used for any other x-coordinate. Many variations are possible.

Figure 5A:
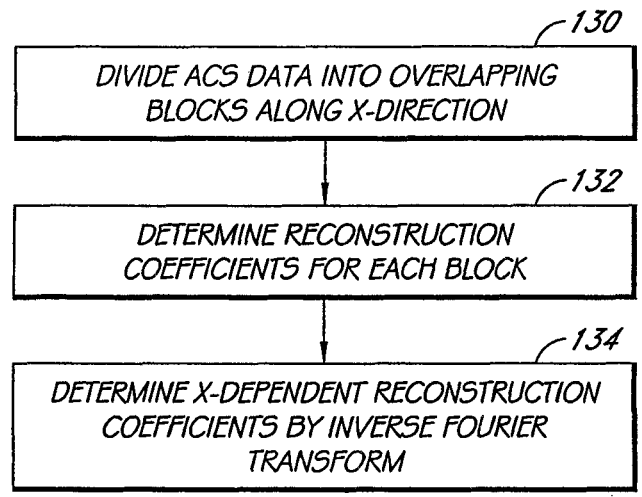
FIGS. 5A and 5B are flowcharts illustrating embodiments of methods for determining x-dependent reconstruction coefficients.

FIG. 5A is a flowchart illustrating one embodiment of the first method for determining x-dependent reconstruction coefficients. In block 130, the ACS data are divided into a sequence of overlapping blocks along the x-direction. The blocks can have any degree of overlap, and the number of blocks is arbitrary. In general, MR image quality improves with an increase in the number of blocks. However, as the number of blocks used increases, the degree by which the system of equations for the reconstruction coefficients is over-determined decreases. It is preferable, although not necessary, to select a width of each block that is sufficiently large so that the degree by which the system is over-determined is greater than about ten. In certain preferred embodiments, adjacent blocks overlap by one column of "x" data. In one embodiment, twelve blocks of overlapping data are used, although different numbers of blocks are used in other embodiments. In block 132, reconstruction coefficients are determined for each overlapping data block, for example, by using a weighted least squares method. In block 134, the reconstruction coefficients $a(i,j,x_1,\tilde{k}_y)$ are evaluated at any arbitrary x-coordinate location by using an interpolation procedure, e.g., linear interpolation. The reconstruction coefficients found by embodiments of the first method may be used in block 88 of the flowchart shown in FIG. 3A to reconstruct the unacquired MRI data.

Figure 5B:
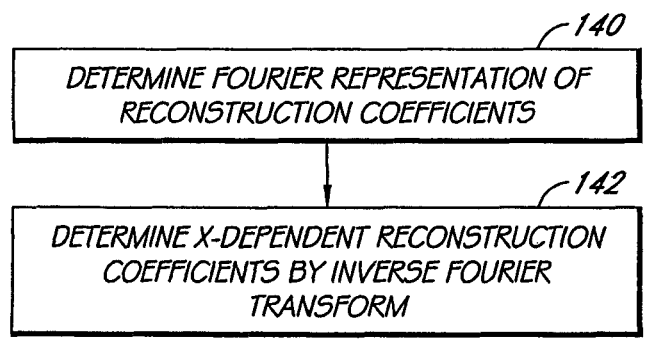

FIG. 5B is a flowchart illustrating one embodiment of a second method for determining x-dependent reconstruction coefficients. In the second method, the reconstruction coefficients $a(i,j,x,\tilde{k}_y)$ are represented by a Fourier series in the x-coordinate $$a(i,j,x,\tilde{k}_y) = \sum_{m=-(N_m-1)/2}^{+(N_m-1)/2} c(i,j,m,\tilde{k}_y)e^{2\pi imx/N_m} \quad (14)$$

where $N_m$ is an odd integer representing the number of terms in the Fourier series. In various preferred embodiments, $N_m$ is a relatively small integer such as, for example, 3, 5, 7, 9, 11, 13, or 15; however, in other embodiments, larger integers are used. In block 140 of the example flowchart in FIG. 5B, the Fourier coefficients $c(i,j,m,\tilde{k}_y)$ are estimated using a fitting procedure with all available ACS data. This generally is a highly over-determined problem, and any suitable fitting procedure such as, for example, a weighted least squares or a robust least squares procedure can be used. In block 142, the x-dependent reconstruction coefficients $a(i,j,x,\tilde{k}_y)$ are calculated from the Fourier coefficients $c(i,j,m,\tilde{k}_y)$ according to Equation (14). The reconstruction coefficients found by embodiments of the second method may be used in block 88 of the flowchart shown in FIG. 3A to reconstruct the unacquired MRI data. A benefit of using embodiments of the second method is that many multi-dimensional auto-calibrating techniques can be converted to the present systems and methods by taking a Fourier transform along x-dimension, e.g., by using Equation (14). The image quality resulting from embodiments of the present systems and methods should be generally similar to the multi-dimensional auto-calibrating techniques.

The reconstruction coefficients for embodiments of the present systems and methods and for the prior art (e.g. GRAPPA) are found by solving an over-determined system of linear equations using the ACS data. An over-determined system of equations may have multiple solutions. The quality of a reconstructed image depends on which of the multiple solutions is selected. In the GRAPPA method, the over-determined system of equations is solved using a least-squares ("LS") method or a singular value decomposition ("SVD") method. The SVD method is rarely used in practice because of its high computation cost. The LS method is computationally efficient, but in many cases the LS solution is not optimal and results in an image with poor quality (e.g., the image has residual aliasing artifacts and substantial noise amplification).

The LS method results in poor image quality due in part to the sensitivity of the LS method to the presence of outliers in the ACS data. Outliers are data points that are located statistically far from the majority of the data. In various embodiments of the present systems and methods, numerical techniques are used that reduce the influence of outliers on the reconstructed image. For example, in certain embodiments, the over-determined system of linear equations for the reconstruction coefficients is solved using a weighted least-squares ("WLS") method or a robust least-squares ("RLS") method. The WLS and RLS methods provide improved reconstruction coefficients (as compared to LS methods), because they are substantially less sensitive to the presence of outliers in the ACS than the LS method.

In some MRI systems, outliers are k-space data from the central region of k-space. In some embodiments of the WLS methods used for data reconstruction, both sides of the system of linear equations [e.g., Eqs. (11) or (12)] are scaled by weights to reduce the influence of outliers on the solution of the linear equations. For example, in certain embodiments, the weights are chosen to be inversely related to a function of the energy of the corresponding line of ACS data. In certain such embodiments, the function is selected to be a power law with an exponent of 1.5 or 2.0; however, other exponents and functions can be used. In other embodiments, the weights are inversely related to a function of the distance of the corresponding line of ACS data from the center of k-space. In certain of these embodiments, the function is a power law with an exponent of 2 or 3; however, other exponents and functions can be used. Although power law functions are used in certain preferred embodiments, many other functions can be selected to reduce the influence of outlying ACS data points on the resulting reconstruction coefficients.

Accordingly, contributions from the outliers are substantially reduced and reliable reconstruction coefficients can be determined. In embodiments using the multiple-block method discussed with reference to FIGS. 4 and 5A, weights that are inversely related to the distance from the center of block can used so that ACS data points farther from the center of a block contribute less to the resulting solution. Many choices can be made for the weights, for example, power laws as described above.

In certain embodiments, RLS methods are used to solve for the reconstruction coefficients. In some of these embodiments, the ACS data are sorted based on their absolute magnitudes, and a fraction of the ACS data having the highest and the lowest values is excluded from the RLS fitting procedure. In certain embodiments, the fraction is selected to be about 25%. In some embodiments, the fraction excluded from the fitting is selected such that the system of linear equations is over-determined by a factor of about ten, for example. Beneficially, in such RLS implementations, the computational efficiency and the speed of the reconstruction is increased, because the amount of the ACS data included in the calculation of the reconstruction coefficients is reduced.

Some embodiments of the present systems and methods use WLS and/or RLS techniques to provide MR images having both a relatively high signal-to-noise ration ("SNR") and relatively few aliasing artifacts. For example, in reconstructions performed using various prior art methods, if a subset of the ACS data having the highest SNRs is used to estimate the reconstruction coefficients, then the resulting MR image typically has relatively few aliasing artifacts but has substantial noise amplification (e.g., low SNR). Conversely, in these prior art methods, if a subset of the ACS data having the lowest SNRs is used to estimate the reconstruction coefficients, then the resulting MR image typically has reasonably good SNR but has significant aliasing artifacts. Accordingly, in some embodiments of the WLS and the RLS methods, the weights adopted and the fractions of the ACS data used are selected so that the reconstruction depends substantially on the ACS data having an SNR similar to the SNR expected for the unacquired data. In some WLS and RLS embodiments, ACS data having the highest SNRs (and/or the lowest SNRs) is largely excluded from the reconstruction. In some preferred WLS and RLS embodiments, the ACS data having both the highest and the lowest SNR is substantially excluded from the reconstruction, which results in improved image quality (e.g., higher SNR) and reduced aliasing artifacts. Accordingly, certain embodiments of the WLS and RLS methods determine reconstruction coefficients that are optimized to the expected SNR of the data to be reconstructed and thereby provide MR images that avoid the limitations of prior art techniques.

Embodiments of the present systems and methods generally use the same number of computational operations as the GRAPPA method to reconstruct the unacquired k-space points, at least for cases in which the number of reconstruction coefficients is the same for both techniques and the coefficients are known. The number of computations required to determine the reconstruction coefficients $a(i,j,x,\tilde{k}_y)$ depends, in the first method, on the number of overlapping blocks and their width, and in the second method, on the number of Fourier terms $N_m$ used in Equation (14). Although the number of computations required for the present systems and methods can be higher than the number of computations needed for the GRAPPA method, the total number of computations is significantly reduced in comparison with many multi-dimensional auto-calibrating techniques. Moreover, a benefit of using embodiments of the above-mentioned methods for determining the reconstruction coefficients is that the Fourier transformation in the x-direction can be evaluated immediately after each readout acquisition, while in multi-dimensional auto-calibrating techniques, the Fourier transformation is delayed until the unacquired k-space samples are determined, which results in a decrease in image reconstruction speed.

In certain embodiments, the first method (e.g., multiple overlapping blocks) and the second method (e.g., the Fourier series) are combined to utilize beneficial features of each method. In certain such embodiments, the ACS data are divided into a relatively small number of overlapping blocks (e.g., 3-5), and Equation (14) is used with a small number of terms (e.g., $N_m$=3 or 5) to find the reconstruction coefficients for each block. Linear interpolation is used to combine the results of the block reconstruction coefficients for spatial positions where the blocks are overlapped.

Although embodiments of several methods for determining spatially dependent reconstruction coefficients $a(i,j,x,\tilde{k}_y)$ are discussed herein, the scope of the concepts disclosed is not intended to be limited to the aforementioned methods. Accordingly, in other embodiments, other techniques can be used to determine the reconstruction coefficients.

The present systems and methods for image reconstruction from sensitivity-encoded MRI data were tested on data from phantoms and from studies on consenting human volunteers. The imaging tests were performed on a Siemens Trio 3 Tesla MRI scanner (Siemens Medical Solutions, Erlangen, Germany) using an eight-channel head coil (MRI Devices, Waukesha, Wis.).

TABLE 1

| Reduction Factor R | Number of ACS lines $N_a$ | RMS Error for Present Reconstruction Method | RMS Error for GRAPPA Reconstruction Method |
|---|---|---|---|
| 2 | 24 | 0.5792 | 0.6042 |
| 3 | 24 | 0.8735 | 1.2174 |
| 4 | 32 | 1.1631 | 1.6308 |
| 5 | 30 | 1.6807 | 2.4551 |
| 6 | 36 | 2.0770 | 2.6265 |

In a first test, a brain of a human volunteer was imaged using a dual contrast (proton density and T2-weighted) 2-D turbo spin echo ("TSE") pulse sequence with the following imaging parameters: repetition time ("TR")=4000 ms, echo time ("TE")=10 ms, echo train length ("ETL")=9, and an imaging matrix of 256.times.261 pixels. TABLE 1 shows the root-mean-square ("RMS") error for an image reconstruction with the present systems and methods and for the GRAPPA method. The reconstruction coefficients were calculated using an embodiment of the Fourier method according to Equation (14). The RMS error was calculated between an image reconstructed from a complete data set (e.g., fully Nyquist sampled) and an image reconstructed from a data set undersampled by the reduction factor R. The number of ACS data lines used to reconstruct the unacquired data is denoted by $N_a$. TABLE 1 shows that for all the reduction factors considered, the present systems and methods give RMS image errors that are smaller than for the GRAPPA method. Additionally, visual comparison of the reconstructed images show that residual aliasing artifacts are smaller in images generated by the present methods than for GRAPPA images. Also, for R>2, GRAPPA reconstructed images have noticeable loss of high-resolution features when compared to images reconstructed by the present methods.

In a second test, both fully sampled and undersampled data of a phantom were acquired using a 2-D gradient echo ("GRE") pulse sequence with the following imaging parameters: field of view ("FOV")=180 mm.times.180 mm, 2 mm slice thickness, imaging matrix=384.times.384 pixels, TR=100 ms, TE=6 ms, flip angle=20.degree. The undersampled data were acquired with reduction factor, R, equal to 2, 3, and 4. The number of auto-calibrating lines, $N_a$, was 24 for R=2 and 3 and 32 for R=4. The image reconstructed from the fully sampled data was considered as the true image, and the RMS difference between the true image and the image reconstructed from the undersampled data was used as a quantitative measure of reconstruction error. Completely sampled data were acquired twice to get a baseline measure of the RMS error caused by the difference between noise contributions in the different datasets.

Figure 6A:
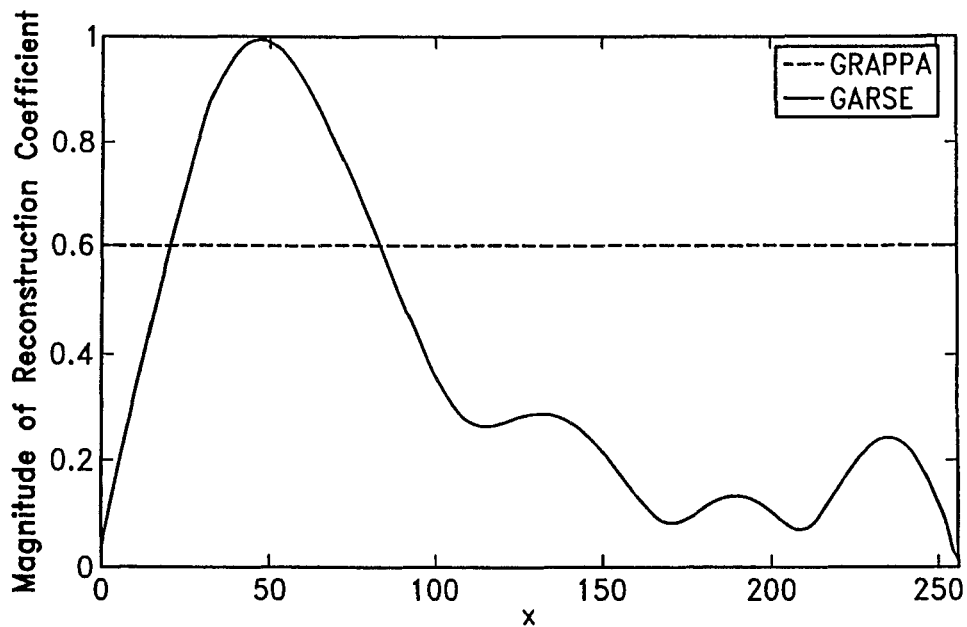
FIGS. 6A and 6B are graphs illustrating the magnitude of reconstruction coefficients versus the x-direction as determined by a prior art method (GRAPPA, dashed lines) and an embodiment of the present method (solid lines).
Figure 6B:
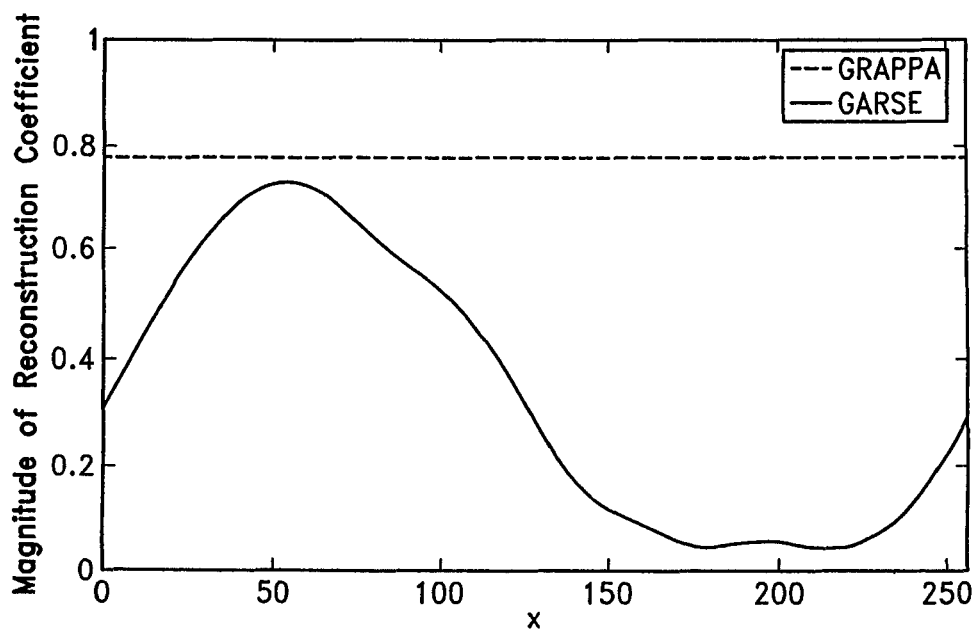

FIGS. 6A and 6B are graphs illustrating the magnitude of two typical reconstruction coefficients as a function of the x-direction. The reconstruction coefficients were calculated using an embodiment of the Fourier method according to Equation (14). The dashed lines show the spatially invariant coefficients as determined by the GRAPPA method, and the solid lines show the spatially varying coefficients according to an embodiment of the present method. The solid lines shown in FIGS. 6A and 6B illustrate the complex spatial dependence of typical coil sensitivities in an MRI system. Embodiments of the present systems and methods, which utilize spatially variable reconstruction coefficients, can more accurately account for coil sensitivities and produce better quality images with lower RMS error than the GRAPPA method, which uses reconstruction coefficients that are constant in the x-direction.

The upper row in FIGS. 7A-7D illustrates images reconstructed by the GRAPPA method (FIGS. 7A and 7C) and by an embodiment of the present method (FIGS. 7B and 7D). The lower row illustrates images showing the magnitude of the difference between the reconstructed image and the true image from the GRAPPA method (FIGS. 7A and 7C) and the present method (FIGS. 7B and 7D). The undersampling rate was R=3 in FIGS. 7A and 7B, and R=4 in FIGS. 7C and 7D. The images generated by the present technique (FIGS. 7B and 7D) utilized the second method for determining the reconstruction coefficients [e.g., Eq. (14)] with $N_m$=7 Fourier terms. FIGS. 7A-7D show that noise amplification and non-resolved aliasing artifacts are minimal in the images reconstructed by the present method (FIGS. 7B and 7D), but they are quite serious in the GRAPPA reconstructed images, especially for the R=4 case (FIGS. 7A and 7C).

In the second test shown in FIGS. 7A-7D, the baseline RMS noise error was 24.4. The RMS errors for the images shown in FIGS. 7A-7D were 106.8, 53.2, 186.6, and 85.1, respectively. Accordingly, the RMS errors for the present method are considerably smaller than for the GRAPPA method (by a factor of 2.0 and a factor of 2.19 for R=3 and 4, respectively). Moreover, the RMS error for the image reconstructed from R=4 data using the present method is smaller than the RMS error for the GRAPPA reconstructed image using R=3 data, which indicates that embodiments of the present systems and methods using higher undersampled MRI data can outperform the GRAPPA method using less undersampled MRI data.

Results similar to those shown in FIGS. 6A-7D have been found for embodiments of the present method which implemented the first method for finding reconstruction coefficients. In some tests, twelve overlapping blocks were used in the interpolation procedure (e.g., see the discussion with reference to FIGS. 4 and 5A). Further tests comparing the present methods to certain multi-dimensional auto-calibrating techniques show that the present methods achieve similar image quality from highly undersampled P-MRI data but beneficially have improved computational efficiency. Accordingly, embodiments of the present methods can advantageously be used in time critical implementations. The dependence of the reconstruction coefficients on the x-coordinate not only allows the coefficients to be optimized to achieve improved image quality but also can be exploited to further speed up image reconstruction and improve resulting image quality by excluding contributions from coils having low or constant sensitivity along the undersampling direction at the given x-coordinate. Additionally, embodiments of the present systems and methods can be used to produce images of comparable quality to GRAPPA images but from sensitivity-encoded MRI data taken at larger reduction factors. Moreover, embodiments of the present systems and methods are can be used with highly undersampled MRI data sets acquired by receiver arrays with arbitrary configurations.

Although certain preferred embodiments and examples are disclosed herein, it is recognized that the inventive subject matter extends beyond the specifically disclosed embodiments to other alternative embodiments and/or uses of the invention, and to obvious modifications and equivalents thereof. Thus it is intended that the scope of the inventions herein disclosed should not be limited by the particular disclosed embodiments described herein. For example, in any method or process disclosed herein, the acts or operations making up the method or process may be performed in any suitable sequence, and are not necessarily limited to any particular disclosed sequence. For purposes of contrasting various embodiments with the prior art, certain aspects and advantages of these embodiments are described where appropriate. Of course, it is to be understood that not necessarily all such aspects or advantages may be achieved in accordance with any particular embodiment. Thus, for example, it should be recognized that the various embodiments described herein may be carried out in a manner that achieves or optimizes one advantage or group of advantages as taught herein without necessarily achieving other aspects or advantages as may be taught or suggested herein.

What is claimed is:

1. A method for reconstructing an actual image from sensitivity encoded magnetic resonance imaging (MRI) data capable of being represented in a frequency domain, the frequency domain comprising at least a phase-encoding direction and a frequency-encoding direction, the phase-encoding and frequency-encoding directions corresponding to a first spatial dimension and a second spatial dimension, respectively, the method comprising:
   acquiring an undersampled MRI data set undersampled in at least the phase-encoding direction;
   determining reconstruction coefficients of the undersampled MRI data set, wherein the reconstruction coefficients have values that vary across at least the second spatial dimension, which corresponds to the frequency-encoding direction, wherein variation of the values of the reconstruction coefficients is based on variation of coil sensitivities;
   determining a reconstructed MRI data set by combining the reconstruction coefficients and the undersampled MRI data set;
   determining a complete MRI data set by combining the undersampled MRI data set and the reconstructed MRI data set; and
   outputting at least a portion of the complete MRI data set to an output device configured for display or onto a non-transitory computer readable medium.

2. The method of claim 1, wherein the undersampled MRI data set comprises an auto-calibration signal data set.

3. The method of claim 1, wherein the act of determining reconstruction coefficients further comprises: dividing at least a portion of the undersampled MRI data set into overlapping blocks along at least the second spatial dimension corresponding to the frequency-encoding direction;
   determining block reconstruction coefficients for each of the overlapping blocks; and
   interpolating among the block reconstruction coefficients to determine values of the reconstruction coefficients.

4. The method of claim 1, wherein the act of determining reconstruction coefficients further comprises using a weighted least squares technique having one or more weights in order to determine the reconstruction coefficients, the weights being inversely related to energies of the detected signals of the undersampled MRI data set or related to distances from a center of the frequency domain.

5. The method of claim 1, wherein the act of determining reconstruction coefficients further comprises using a robust least squares technique in order to determine the reconstruction coefficients, wherein the robust least squares technique excludes a portion of the undersampled MRI data set from the act of determining reconstruction coefficients, the excluded portion corresponding to MRI data having magnitudes below a first percentile and having magnitudes above a second percentile.

6. The method of claim 1, wherein the act of combining the reconstruction coefficients and the undersampled MRI data set further comprises linearly combining the reconstruction coefficients and the undersampled MRI data set within one or more neighborhoods, the neighborhoods being spatially varying with respect to at least the second spatial dimension.

7. The method of claim 1, further comprising:
   determining coil images from the complete MRI data set for each of two or more receiver coils; and
   outputting an MRI image from the coil images to the output device or onto the computer readable medium.

8. A method for reconstructing an actual image from sensitivity encoded magnetic resonance imaging (MRI) data capable of being represented in a frequency domain, the frequency domain comprising at least a phase-encoding direction and a frequency-encoding direction, the phase-encoding and frequency-encoding directions corresponding to a first spatial dimension and a second spatial dimension, respectively, the method comprising:
   acquiring an undersampled MRI data set, undersampled in at least the phase-encoding direction, from each of two or more receiver coils;
   determining reconstruction coefficients of the undersampled MRI data set for each of the two or more receiver coils, the reconstruction coefficients having values that vary across at least the second spatial dimension which corresponds to the frequency-encoding direction, wherein variation of the values of the reconstruction coefficients is based on variation of coil sensitivities;
   outputting at least a portion of a complete MRI data set, based on the undersampled MRI data set and a reconstructed MRI data set, to an output device configured for display or onto a non-transitory computer readable medium.

9. The method of claim 8, further comprising determining the reconstructed MRI data set, configured to be represented in a portion of the frequency domain, for each of the two or more receiver coils by combining the reconstruction coefficients and the undersampled MRI data set from at least one of the two or more receiver coils, the portion comprising representative locations in the frequency domain wherein the undersampled MRI data set has not been acquired.

10. The method of claim 9, further comprising determining the complete MRI data set for each of the two or more receiver coils by combining the undersampled MRI data set and the reconstructed MRI data set.

11. The method of claim 10, wherein the undersampled MRI data set comprises an auto-calibration signal data set.

12. The method of claim 10, wherein the act of determining reconstruction coefficients further comprises:
dividing at least a portion of the undersampled MRI data set into overlapping blocks along at least the second spatial dimension corresponding to the frequency-encoding direction;
determining block reconstruction coefficients for each of the overlapping blocks; and
interpolating among the block reconstruction coefficients to determine values of the reconstruction coefficients at a location in the second spatial dimension.

13. The method of claim 10, wherein the act of determining reconstruction coefficients further comprises using a weighted least squares technique having one or more weights in order to determine the reconstruction coefficients, the weights being inversely related to energies of the detected signals of the undersampled MRI data set or related to distances from a center of the frequency domain.

14. The method of claim 10, wherein the act of determining reconstruction coefficients further comprises using a robust least squares technique in order to determine the reconstruction coefficients, wherein the robust least squares technique excludes a portion of the undersampled MRI data set from the act of determining reconstruction coefficients, the excluded portion corresponding to MRI data having magnitudes below a first percentile and having magnitudes above a second percentile.

15. The method of claim 10, wherein the act of combining the reconstruction coefficients and the undersampled MRI data set further comprises linearly combining the reconstruction coefficients and the undersampled MRI data set within one or more neighborhoods that include at least one of the locations in the portion of the frequency domain, the neighborhoods being spatially varying with respect to at least the second spatial dimension.

16. The method of claim 10, further comprising:
determining coil images from the complete MRI data set for each of the two or more receiver coils; and
outputting an MRI image from the coil images to the output device or onto the non-transitory computer readable medium.

17. A method for reconstructing an actual image from sensitivity encoded magnetic resonance imaging (MRI) data capable of being represented in a frequency domain, the frequency domain comprising at least a phase-encoding direction and a frequency-encoding direction, the phase-encoding and frequency-encoding directions corresponding to a first spatial dimension and a second spatial dimension, respectively, the method comprising:
acquiring a undersampled MRI data set undersampled in at least the phase-encoding direction;
determining reconstruction coefficients of the undersampled MRI data set, wherein the reconstruction coefficients spatially vary in values in at least the second spatial dimension, which corresponds to the frequency-encoding direction, and the reconstruction coefficients are determined based on receiver coil sensitivities and coordinate values of at least one non-phase encoding direction;
determining a reconstructed MRI data set by combining the reconstruction coefficients and the undersampled MRI data set;
determining a complete MRI data set by combining the undersampled MRI data set and the reconstructed MRI data set; and
outputting at least a portion of the complete MRI data set to an output device configured for display or onto a non-transitory computer readable medium.

18. The method of claim 17, wherein the undersampled MRI data set comprises an auto-calibration signal data set.

19. The method of claim 17, wherein the act of determining reconstruction coefficients further comprises using a weighted least squares technique having one or more weights in order to determine the reconstruction coefficients, the weights being inversely related to energies of the detected signals of the undersampled MRI data set or related to distances from a center of the frequency domain.

20. The method of claim 17, wherein the act of combining the reconstruction coefficients and the undersampled MRI data set further comprises linearly combining the reconstruction coefficients and the undersampled MRI data set within one or more neighborhoods, the neighborhoods being spatially varying with respect to at least the second spatial dimension.

* * * * *

UNITED STATES PATENT AND TRADEMARK OFFICE
CERTIFICATE OF CORRECTION

PATENT NO. : 8,427,156 B2
APPLICATION NO. : 12/972192
DATED : April 23, 2013
INVENTOR(S) : Evgueni G. Kholmovski et al.

It is certified that error appears in the above-identified patent and that said Letters Patent is hereby corrected as shown below:

In the Specification:

The paragraph beginning at column 1, line 23, "This invention was made with government support under Contract Numbers R01HL53596, R01EB177-02, R01HL57990, and R01HL48223 awarded by the National Institutes of Health. The government has certain rights to this invention." should read -- This invention was made with government support under R01 EB000177, R01 HL053596, R01 HL048223 and R01 HL057990 awarded by the National Institutes of Health. The government has certain rights in the invention. --.

Signed and Sealed this
Twenty-second Day of March, 2016

Michelle K. Lee
*Director of the United States Patent and Trademark Office*